(12) United States Patent
Okamoto

(10) Patent No.: US 10,134,951 B2
(45) Date of Patent: Nov. 20, 2018

(54) LIGHT EMITTING DEVICE METHOD OF MANUFACTURE

(71) Applicant: NICHIA CORPORATION, Anan-shi, Tokushima (JP)

(72) Inventor: Kazuto Okamoto, Tokushima (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 15/688,057

(22) Filed: Aug. 28, 2017

(65) Prior Publication Data

US 2018/0062032 A1  Mar. 1, 2018

(30) Foreign Application Priority Data

Aug. 29, 2016 (JP) ................. 2016-167419

(51) Int. Cl.
| | |
|---|---|
| H01L 21/00 | (2006.01) |
| H01L 33/08 | (2010.01) |
| H01L 33/20 | (2010.01) |

(52) U.S. Cl.
CPC .............. H01L 33/08 (2013.01); H01L 33/20 (2013.01)

(58) Field of Classification Search
CPC .... H01L 21/02008–21/0201; H01L 21/02021; H01L 21/02027; H01L 21/02035; H01L 33/08; H01L 33/16; H01L 33/18; H01L 33/20; H01L 33/36
See application file for complete search history.

(56) References Cited

U.S. PATENT DOCUMENTS

| | | | | |
|---|---|---|---|---|
| 5,578,840 A | * | 11/1996 | Scepanovic | G06F 17/5072 257/206 |
| 2009/0008654 A1 | * | 1/2009 | Nagai | H01L 25/0753 257/88 |
| 2010/0240159 A1 | | 9/2010 | Kumagai et al. | |

(Continued)

FOREIGN PATENT DOCUMENTS

| | | |
|---|---|---|
| JP | 2009064983 A | 3/2009 |
| JP | 2012028450 A | 2/2012 |

(Continued)

*Primary Examiner* — Thanh Y Tran

(74) *Attorney, Agent, or Firm* — Hunton Andrews Kurth LLP

(57) ABSTRACT

A method of manufacturing a light emitting device includes preparing a wafer having a sapphire substrate with semiconductor structures, forming a plurality of straight-line cleavage starting portions within the substrate by scanning a laser beam, and cleaving the wafer along the cleavage starting portions to obtain a plurality of light emitting devices each having a hexagonal shape. The forming step includes forming first cleavage starting portions with each first cleavage starting portion separated by a first interval from a common vertex point of three adjacent light emitting devices, forming second cleavage starting portions with each first cleavage starting portion separated by a second interval, which is shorter than the first interval, away from the common vertex point, and forming third cleavage starting portions with each first cleavage starting portion separated by a third interval, which is shorter than the first interval, away from the common vertex point.

20 Claims, 10 Drawing Sheets

(56) References Cited

U.S. PATENT DOCUMENTS

| | | | |
|---|---|---|---|
| 2011/0133235 A1* | 6/2011 | Hoshino | H01L 33/007 257/98 |
| 2013/0023076 A1 | 1/2013 | Uchiyama | |
| 2013/0105761 A1* | 5/2013 | Lim | H01L 33/007 257/13 |

FOREIGN PATENT DOCUMENTS

| | | | |
|---|---|---|---|
| JP | 2012028452 A | 2/2012 | |
| JP | 2013042119 A | 2/2013 | |

* cited by examiner

LIGHT EMITTING DEVICE METHOD OF MANUFACTURE

CROSS-REFERENCE TO RELATED APPLICATIONS

The present application claims priority under 35 U.S.C. § 119 to Japanese Patent Application No. 2016-167,419, filed on Aug. 29, 2016, the entire disclosures of which are incorporated by reference.

BACKGROUND OF THE INVENTION

1. Field of the Invention

The present disclosure relates to a method of manufacturing light emitting devices.

2. Description of the Related Art

Japanese Laid-Open Patent Publication 2013-042119 discloses preparation of a wafer having a sapphire substrate with semiconductor layers disposed on the upper surface, and subsequent formation of material modified regions (where material properties of the substrate crystal are altered, hereinafter referred to as "modified region(s)") by laser beam irradiation inside the sapphire substrate. Further, by cleaving the wafer along scribe lines coincident (as viewed from above the wafer) with the modified regions, a plurality of light emitting devices can be obtained from a single wafer (so-called die separation, singulation, or dicing).

Since each light emitting device obtained by die separation according to the light emitting device method of manufacture referenced above has a rectangular shape in plan view, wafer cleaving lines establish a rectangular grid pattern in plan view. Consequently, even if cracks extend along cleaving lines coincident with the modified regions, the probability is low that those cracks extend into regions corresponding to the light emitting devices after die separation (subsequently referred to as light emitting device regions). However, in the case of light emitting devices having a hexagonal shape in plan view, linear extension of the cleaving lines laterally intrudes into light emitting device regions. Accordingly for hexagonal light emitting devices, there is a higher probability that cracks propagating from the modified regions extend into light emitting device regions. Since cracks that extend into light emitting device area have a detrimental impact on wafer cleaving and result in defects such as die chipping and yield reduction.

One of the objects of the present invention is to provide a light emitting device method of manufacture that can suppress crack extensions from modified regions into light emitting device active regions and can increase yield.

SUMMARY

One aspect of a method of manufacturing a light emitting device according to the present invention includes a step to prepare a wafer having a sapphire substrate with semiconductor structures disposed on the upper surface of the substrate; a step to form a plurality of straight-line cleavage starting portions within the substrate by scanning laser beam; and a step to cleave the wafer along the cleavage starting portions to obtain a plurality of light emitting devices each having a hexagonal shape in plan view. The step to form a plurality of cleavage starting portions includes forming first cleavage starting portions such that each of the first cleavage starting portions is separated by a first interval from a common vertex point of three adjacent light emitting devices, and a straight-line extending from the first cleavage starting portion passes through the common vertex point; forming second cleavage starting portions such that each scribe is separated by a second interval, which is shorter than the first interval, away from the common vertex point, and a straight-line extending from the second cleavage starting portion passes through the common vertex point and forms a substantially 120° angle with the straight-line extending from the first cleavage starting portion; and forming third cleavage starting portions such that each scribe is separated by a third interval, which is shorter than the first interval, away from the common vertex point, and a straight-line extending from the third cleavage starting portion passes through the common vertex point and forms substantially 120° angles with both the straight-line extending from the first cleavage starting portion and the straight-line extending from the second cleavage starting portion.

By employing the above manufacturing method, cracks extending from the cleavage starting portions that extend into light emitting device regions can be suppressed. Therefore, light emitting devices can be manufactured with high yield.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings.

DESCRIPTION

Figure 1:
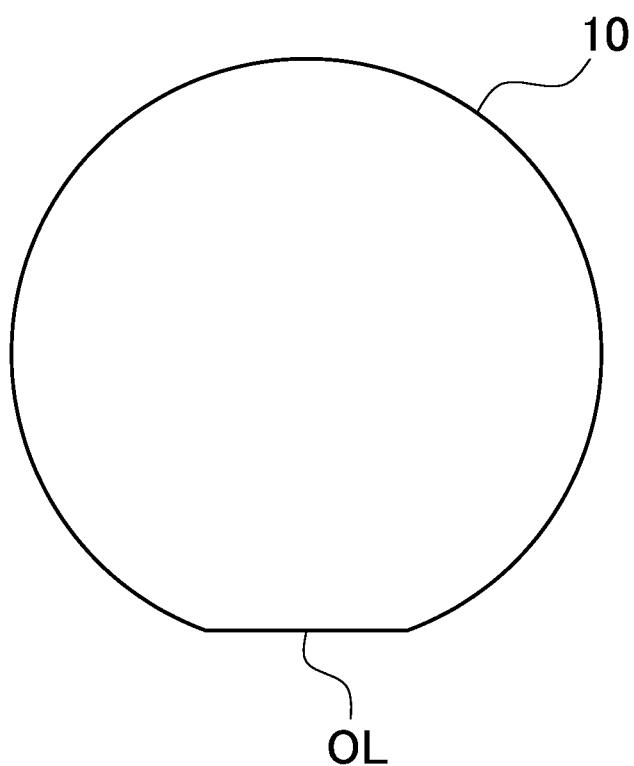
FIG. 1 is a plan view schematically showing a wafer used in an embodiment of the method of manufacture of the present disclosure.
Figure 2:
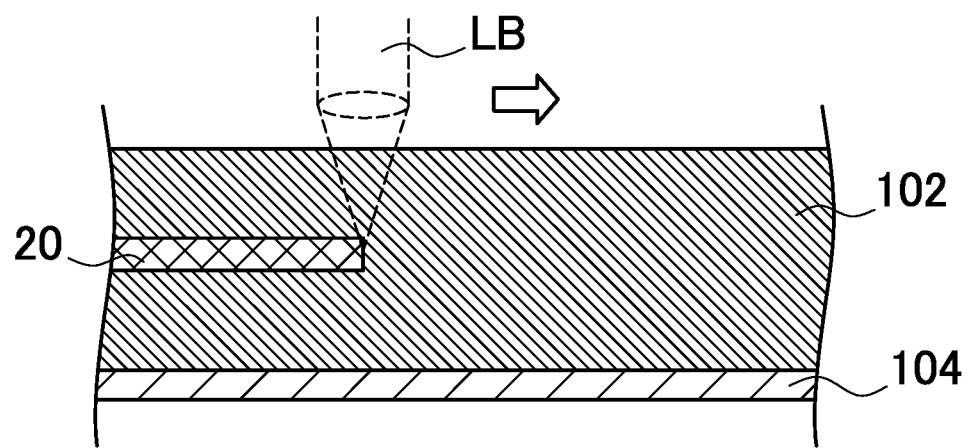
FIG. 2 is a cross-section view schematically showing an example of a laser scribe for wafer cleaving formed by focusing laser light within the substrate.
Figure 3:
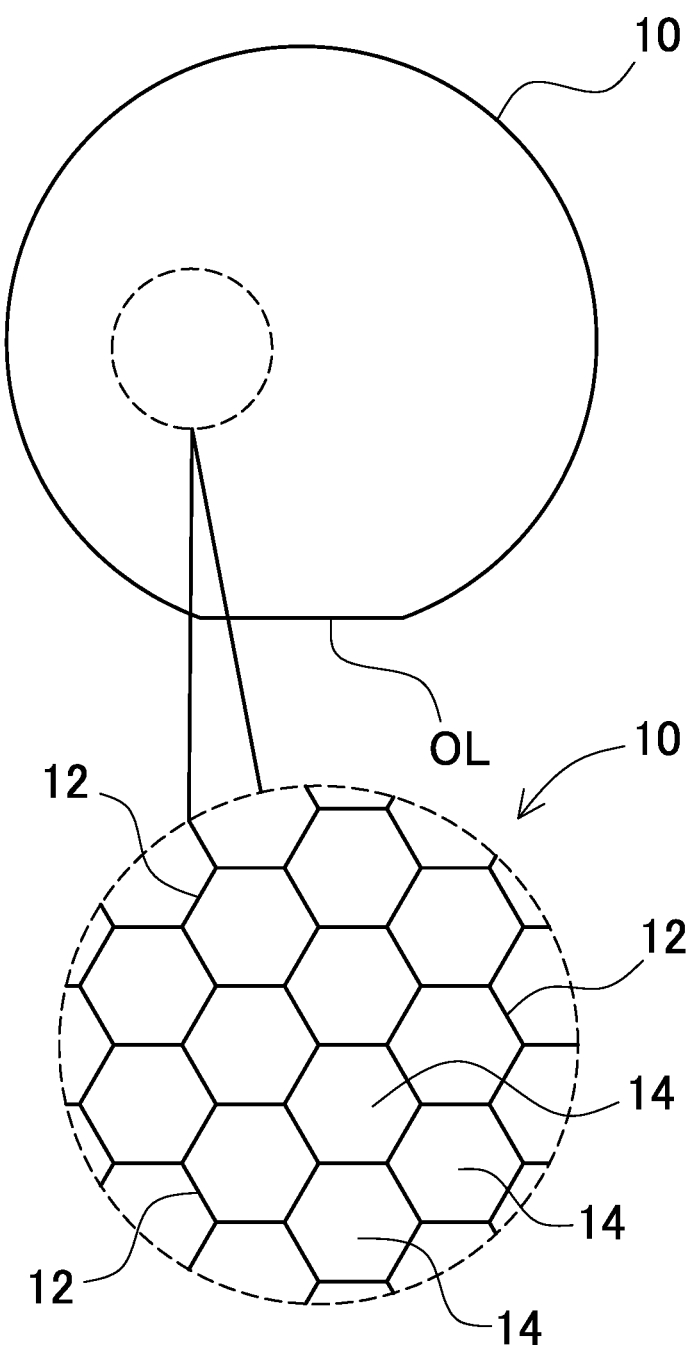
FIG. 3 is a plan view with an enlarged inset schematically showing an example of a plurality of light emitting device regions formed on the wafer shown in FIG. 1.
Figure 4:
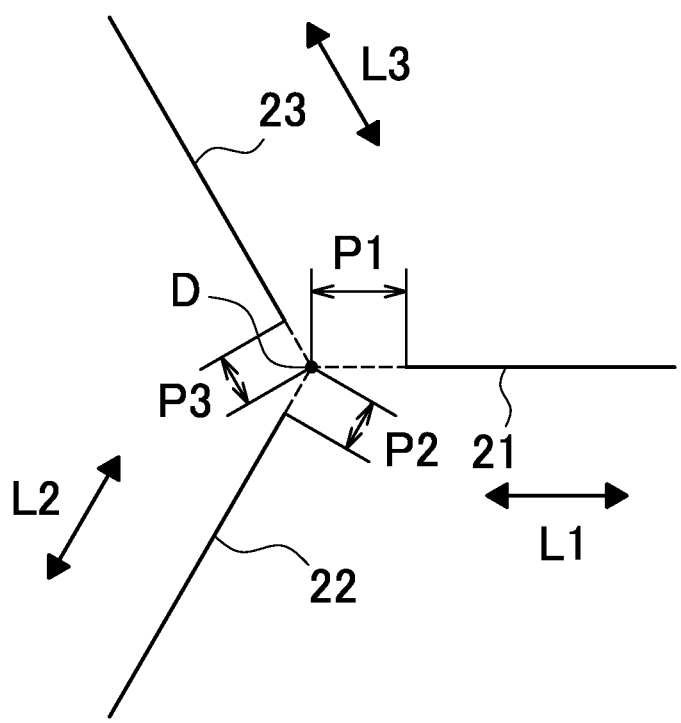
FIG. 4 is a diagram schematically showing the first, second, and third cleavage starting portions formed for an embodiment of the method of manufacture of the present disclosure.
Figure 5A:
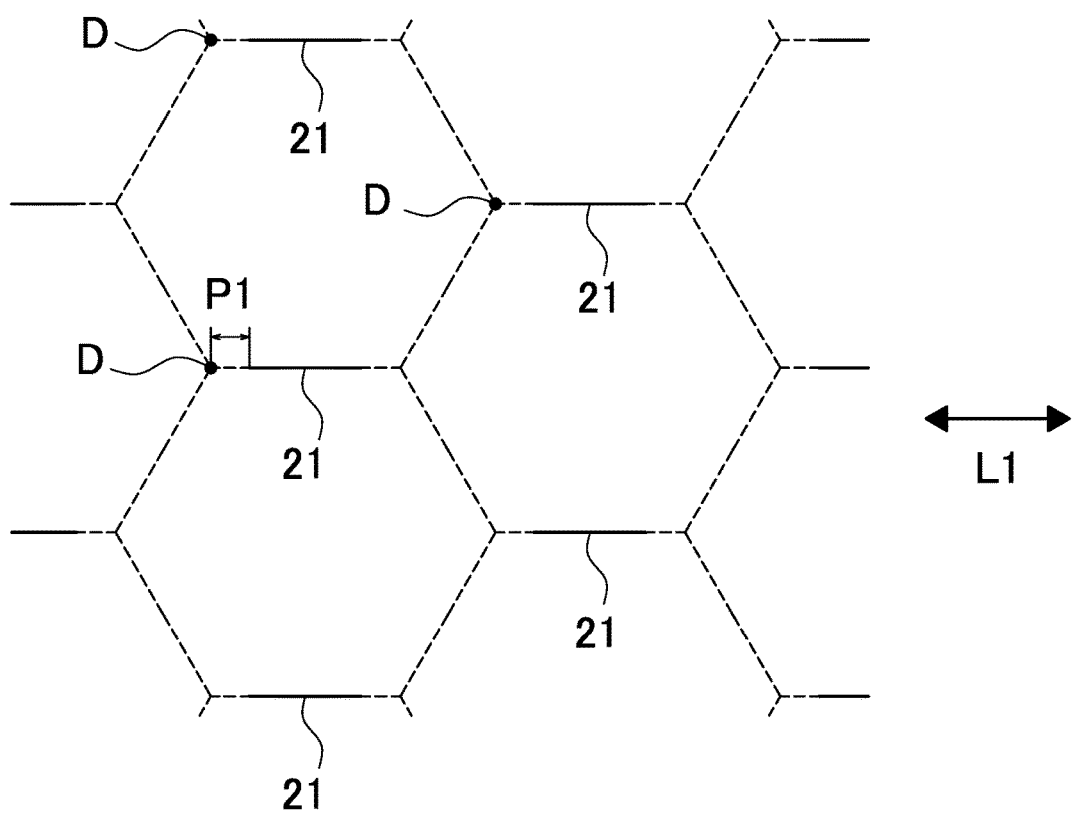
FIG. 5A is a plan view schematically showing first cleavage starting portions formed by focusing laser light within the substrate.
Figure 5B:
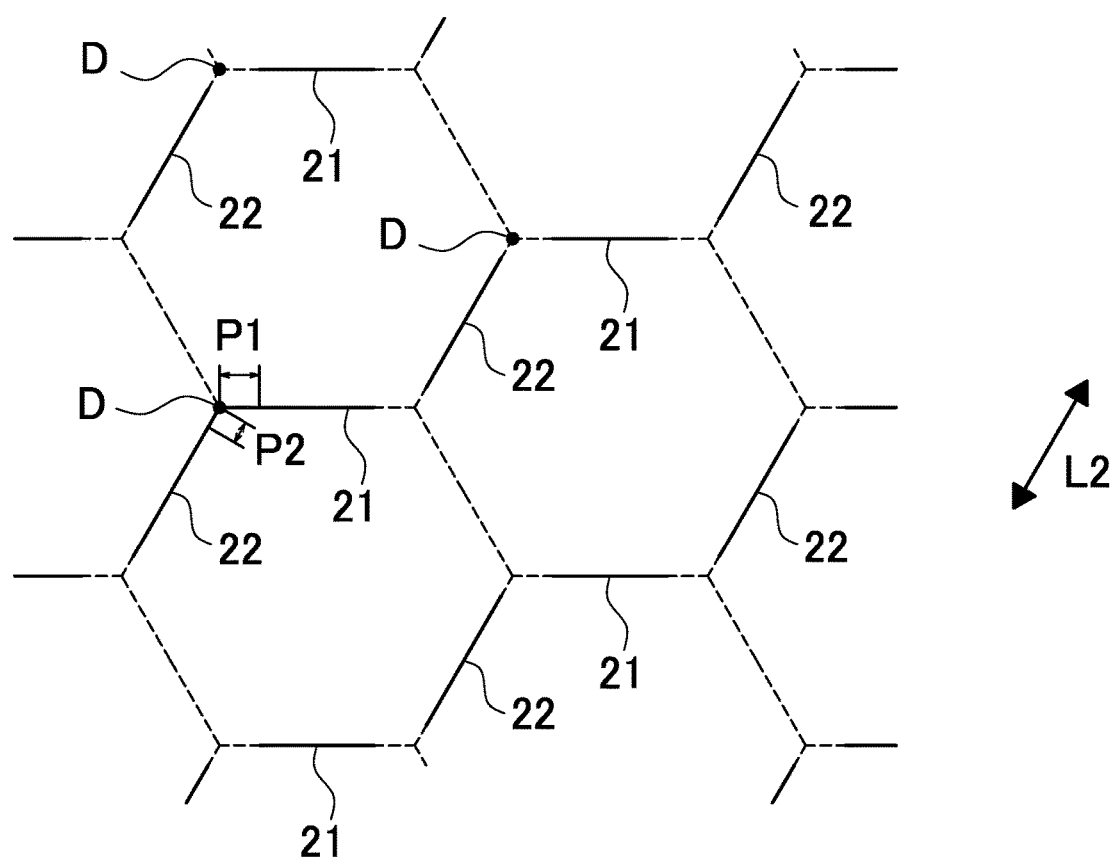
FIG. 5B is a plan view schematically showing second cleavage starting portions formed by focusing laser light within the substrate.
Figure 5C:
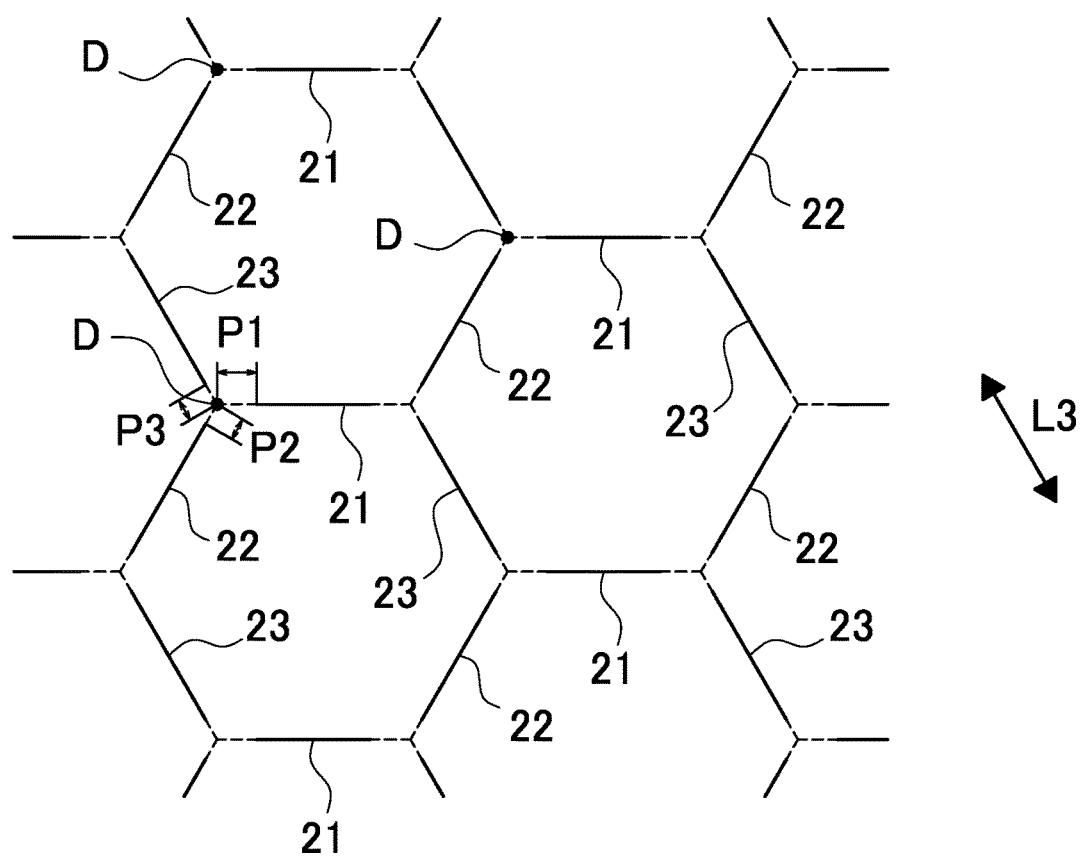
FIG. 5C is a plan view schematically showing third cleavage starting portions formed by focusing laser light within the substrate.
Figure 7:
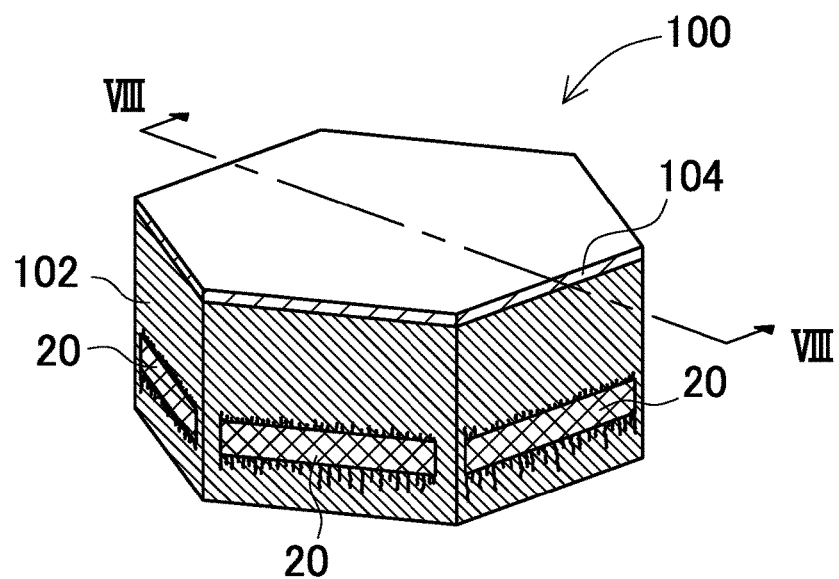
FIG. 7 is an oblique view schematically showing a light emitting device produced by an embodiment of the method of manufacture of the present disclosure.
Figure 8:
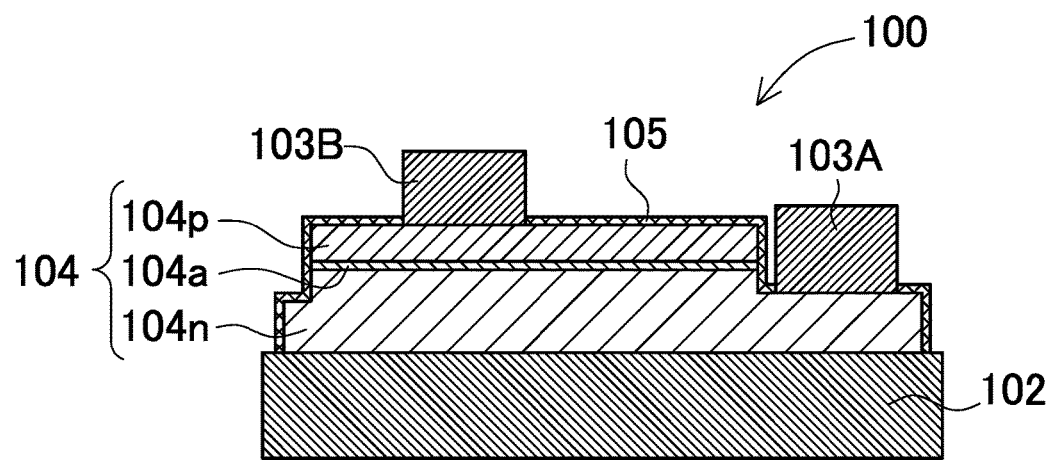
FIG. 8 is a cross-section through the line VIII-VIII in FIG. 7 schematically showing a light emitting device produced by an embodiment of the method of manufacture of the present disclosure.

The embodiments will now be described with reference to the accompanying drawings, wherein like reference numerals designate corresponding or identical elements throughout the various drawings. FIG. 1 is a top view showing a wafer 10 used in the present embodiment of the light emitting device 100 method of manufacture. FIG. 2 is a cross-section view illustrating cleavage starting portion 20 formation inside the substrate 102. FIG. 3 shows a wafer 10 with one section enlarged to illustrate formation of a plurality of light emitting device regions 14 on the wafer 10 surface. FIG. 4 is a top view illustrating the first, second, and third cleavage starting portions 21, 22, 23 formed according to the present embodiment of the method of manufacture. FIG. 5A is a top view of the wafer 10 illustrating the regions of first cleavage starting portion 21 formation inside the substrate 102. FIG. 5B is a top view of the wafer 10 illustrating the regions of second cleavage starting portion 22 formation inside the substrate 102. FIG. 5C is a top view of the wafer 10 illustrating the regions of third cleavage starting portion 23 formation inside the substrate 102. FIG. 7 is an oblique view showing a light emitting device 100. FIG. 8 is a cross-section through the line VIII-VIII in FIG. 7.

The light emitting device 100 method of manufacture is provided with a step to prepare a wafer 10 having a sapphire substrate 102 with semiconductor structures 104 disposed on the upper surface of the substrate 102; a step to form a plurality of straight-line cleavage starting portions 20 (first cleavage starting portions 21, second cleavage starting portions 22, and third cleavage starting portions 23) within the substrate 102 by scanning laser beam; and a step to cleave the wafer 10 along the cleavage starting portions 20 to obtain a plurality of light emitting devices 100 each having a hexagonal shape in plan view. The step to form a plurality of cleavage starting portions 20 has, in the following order, a step to form first cleavage starting portions 21 with each scribe separated by a first interval P1 away from a common vertex point D of three adjacent hexagonal light emitting devices 100 and a straight-line extending from the first cleavage starting portion 21 passes through the common vertex point D; a step to form second cleavage starting portions 22 with each scribe separated by a second interval P2, which is shorter than the first interval P1, away from the common vertex point D and a straight-line extending from the second cleavage starting portion 22 passes through the common vertex point D and forms a substantially 120° angle with the straight-line extending from the first cleavage starting portion 21; and a step to form third cleavage starting portions 23 with each scribe separated by a third interval P3, which is shorter than the first interval P1, away from the common vertex point D and a straight-line extending from the third cleavage starting portion 23 passes through the common vertex point D and forms substantially 120° angles with both the straight-line extending from the first cleavage starting portion 21 and the straight-line extending from the second cleavage starting portion 22.

This method can suppress crack extensions into light emitting device regions 14 when those cracks extend from the end of a cleavage starting portion 20 and extend in the cleavage starting portion 20 direction, viewed from above, towards a light emitting device region 14. Consequently, light emitting devices having a hexagonal layout (hexagonal shape in plan view) can be manufactured with high yield. This assertion is further described below.

In the case where planar wafer 10 area is fully occupied by a plurality of light emitting device regions 14 each having a hexagonal layout and where the wafer 10 is cleaved to singulate the light emitting devices 100, straight-line cleavage starting portions 20 are formed by focusing laser beam inside the substrate 102 as shown in FIG. 2. Here, a line extending from a cleavage starting portion 20 corresponding to one side of a hexagonal light emitting device region 14 will pass into the active area of another light emitting device region 14. Further, when a given time has passed after cleavage starting portion 20 formation, cracks extending from both ends of the cleavage starting portion 20 progressively extend along the direction of the cleavage starting portion 20. Accordingly, the possibility exists for cracking to progressively extend from the cleavage starting portions 20 into light emitting device regions 14.

Considering of these observations, each first cleavage starting portion 21 formed in the first cleavage starting portion formation step is made with first interval P1 separation from the common vertex point D, as shown in FIG. 4. Next, each second cleavage starting portion 22 formed in the second cleavage starting portion formation step is separated from the common vertex point D by a second interval P2, which is shorter than the first interval P1. Further, each third cleavage starting portion 23 formed in the third cleavage starting portion formation step is separated from the common vertex point D by a third interval P3, which is shorter than the first interval P1. This configuration can restrain cracks extending from the initially formed first cleavage starting portion 21 (subsequently referred to as first cracks) from extending into a light emitting device region 14 while simultaneously enabling connection or close proximity at point D of first cracks with cracks extending from the second cleavage starting portion 22 (subsequently referred to as second cracks). For this reason, die chipping during wafer cleaving can be suppressed and wafer cleaving can be easily accomplished with relative ease. This enables light emitting device 100 manufacture with high yield.

The following describes the method of manufacture of light emitting devices 100 in further detail.

Wafer Preparation Step

First, a wafer 10 having a sapphire substrate 102 is prepared with semiconductor structures disposed on the upper surface of the substrate 102. As shown in the top view of FIG. 1, the wafer 10 is approximately circular in plan view and has an orientation flat OL, which is a segment cut along a chord line to indicate crystal orientation. The wafer 10 can be on the order of 50 mm to 150 mm in diameter with a thickness of 50 μm to 500 μm, for example.

Cleavage Starting Portion Formation Step

Next, as shown in FIG. 2, a plurality of cleavage starting portions 20, which initiate wafer 10 breaking during the cleaving operation, is formed by focusing laser beam LB light within the substrate 102. Each of the plurality of cleavage starting portions 20 is formed in a straight-line as viewed from above the wafer 10, and each cleavage starting portion 20 is formed to overlap with a cleaving line 12 along which the wafer 10 breaks during cleaving. In the present embodiment, a single cleavage starting portion 20 is formed by focusing the laser beam inside the substrate 102 a plurality of times at close intervals while scanning the laser with respect to the wafer 10. Each cleavage starting portion 20 is a region within the substrate 102 where material properties are locally altered along the row of laser focal points and their immediate vicinity. When the wafer 10 is cleaved, this modified region can be observed as a region of micro-roughness within smoother substrate 102 material along a cleaved edge (see FIG. 7).

Although a single cleavage starting portion 20 is formed in the thickness direction of the substrate 102 for the present embodiment shown in FIG. 2, a plurality of cleavage starting portions 20 can be formed in the thickness direction of the substrate 102, for example when the substrate 102 is thick and difficult to cleave.

As shown in FIG. 2, it is desirable to irradiate laser light (focused inside the substrate 102) from the side of the wafer 10 opposite the semiconductor structures 104 disposed on the upper surface. Namely, it is preferable to irradiate laser light into the lower surface of the wafer 10. This allows the cleavage starting portions 20 to be formed inside the substrate 102 while avoiding damages to semiconductor structures due to direct laser irradiation.

In the case of laser irradiation from the lower surface of the substrate 102, it is desirable to focus the laser inside the substrate 102, for example, at locations greater than or equal to 70 μm away from the layer of semiconductor structures 104. This laser focal depth can minimize semiconductor structure 104 laser damages.

In the cleavage starting portion 20 formation step, a plurality of first cleavage starting portions 21, a plurality of second cleavage starting portions 22, and a plurality of third cleavage starting portions 23 are formed with the first, second, and third cleavage starting portions having different angular orientation on the wafer 10 as viewed from above. In each of the first, second, and third cleavage starting portion formation steps shown in FIGS. 5A-5C, a plurality of cleavage starting portion 21, 22, 23 straight-line segments is formed in a non-continuous manner. This enables formation of cleaving lines 12 for singulating hexagonal light emitting devices 100 in plan view, and partitions the wafer 10 into a plurality of light emitting device regions 14, as shown in FIG. 3. Each cleaving line 12 is established by a cleavage starting portion 20 and cracking that extends linearly from that cleavage starting portion 20. As described subsequently in the wafer cleaving (die singulation) step, a plurality of light emitting device 100 dies are separated by wafer cleaving along the cleaving lines 12.

As shown in FIG. 3, the cleavage starting portions 20 are formed to pattern the wafer 10 into light emitting device regions 14 and establish a plurality of light emitting devices 100 with hexagonal shapes in plan view. Here, the cleavage starting portions 20 coincide with zigzagging lines that traverse the wafer 10 surface. Further, to minimize wasted area, light emitting device regions 14 are laid-out to completely occupy the planar area of the wafer 10. In the present embodiment, each light emitting device region 14 is an equal-sided regular hexagon (equilateral and equiangular hexagon), and the array of light emitting device regions 14 forms a honeycomb pattern. A side of the regular hexagon that establishes light emitting device regions 14 can be, for example, on the order of 1000 μm to 3000 μm.

When the plurality of cleavage starting portions 20 is formed, it is desirable to establish either first cleavage starting portions 21, second cleavage starting portions 22, or third cleavage starting portions 23 between adjacent vertex points D of a hexagonal light emitting device region 14. Specifically, in the steps to form first, second, and third cleavage starting portions, cleavage starting portions 20 are formed respectively along opposing parallel sides of a hexagonal region. This allows cleaving lines 12 for die separation of hexagon-shaped light emitting devices 100 to be established in a minimal number of cleavage starting portion formation steps.

It is preferable to form the plurality of cleavage starting portions 20 in line with sapphire crystal substrate 102 a-planes. Specifically it is preferable to form cleavage starting portions 20 corresponding to at least one side of the hexagonal light emitting device regions 14 in line with an a-plane of the substrate 102. For a sapphire substrate 102 having a hexagonal crystal structure, there is less tendency for cracks to extend from a cleavage starting portion 20 arranged along an a-plane of the crystal substrate 102 than from a cleavage starting portion 20 established along an m-plane of the substrate 102 due to sapphire crystallography. Consequently, continuation of cracks extending in the direction of light emitting device regions 14 can be suppressed.

Laser beam is irradiated into the wafer 10 in a pulsed mode. In this case, laser output can be, for example, on the order of 0.5W to 5W. Laser frequency can be, for example, 50 kHz to 200 kHz. Laser pulse width can be, for example, 300 fs to 50000 fs (1 femtosecond=$10^{-15}$ second). The present embodiment uses a femtosecond laser with an 800 nm center wavelength. Laser wavelength can be 500 nm to 1100 nm, and the laser scanning speed can be 20 mm/sec to 2000 mm/sec.

The following describes the first, second, and third cleavage starting portion formation steps within the cleavage starting portion 20 formation step.

First Cleavage Starting Portion Formation Step

As shown in FIGS. 4 and 5A, each first cleavage starting portion 21 is separated by a first interval P1 from a vertex point D common to three adjacent hexagonal light emitting devices. Here, the first cleavage starting portion 21 is formed as a line segment such that a first straight-line L1 extending from the first cleavage starting portion 21 will pass through the common vertex point D. The vertex point D common to three adjacent light emitting devices is a vertex point shared by three adjacent light emitting device regions 14 when the planar wafer 10 area is fully occupied by hexagonal light emitting device regions 14. Note that if a first cleavage starting portion 21 is formed continuously up to the vertex point D without leaving a first interval P1, first cracks extending from the first cleavage starting portion 21 will extend into the adjacent light emitting device region 14. In contrast, since the present embodiment forms first cleavage starting portions 21 while leaving first interval P1 separation from each vertex point D, first crack extensions into light emitting device regions 14 are suppressed.

The first interval P1 can be, for example, greater than or equal to 12 μm and less than or equal to 20 μm, and preferably greater than or equal to 14 μm and less than or equal to 18 μm. By making the first interval P1 greater than or equal to 12 μm, first crack extensions into light emitting device regions 14 can be suppressed. Further, making the first interval P1 less than or equal to 16 μm enables accurate connection or close approach of first cracks with cracks extending from other cleavage starting portions 20.

When the laser is scanned over the wafer 10 in a single scanning direction for each of the steps to form first, second, and third cleavage starting portions and establish regular hexagonal light emitting device regions 14 completely filling the wafer 10 planar area, three vertex points at every other vertex point of a six vertex hexagonal light emitting device region 14 are taken as the vertex points D for cleavage starting portion formation. Namely, three vertex points of a hexagonal light emitting device region 14 is the maximum number that can be taken as vertex points D.

Accordingly, in the first cleavage starting portion formation step, it is desirable to form first cleavage starting portions 21 by scanning the laser towards every other vertex point (three points) of each six vertex hexagonal light emitting device region 14. Consequently, the present embodiment is effective at numerous locations, and crack extensions from cleavage starting portions 20 into light emitting device regions 14 are effectively suppressed.

When a plurality of first cleavage starting portions 21 are formed, each individual first cleavage starting portion 21 (segment) is formed by scanning the laser from a scan starting point to a scan end point. Here, it is preferable to form the first cleavage starting portion 21 leaving a first interval P1 between the laser scanning end point and the vertex point D. Crack extensions from a cleavage starting portion 20 have a dependency on the direction in which laser scanning proceeds, and there is a tendency for cracking to extend more readily from laser scan end points than from starting points. Therefore, crack extensions from a cleavage starting portion 20 into a light emitting device region 14 can be effectively suppressed by increasing the distance between the laser scanning end point and the associated vertex point D.

Figure 6A:
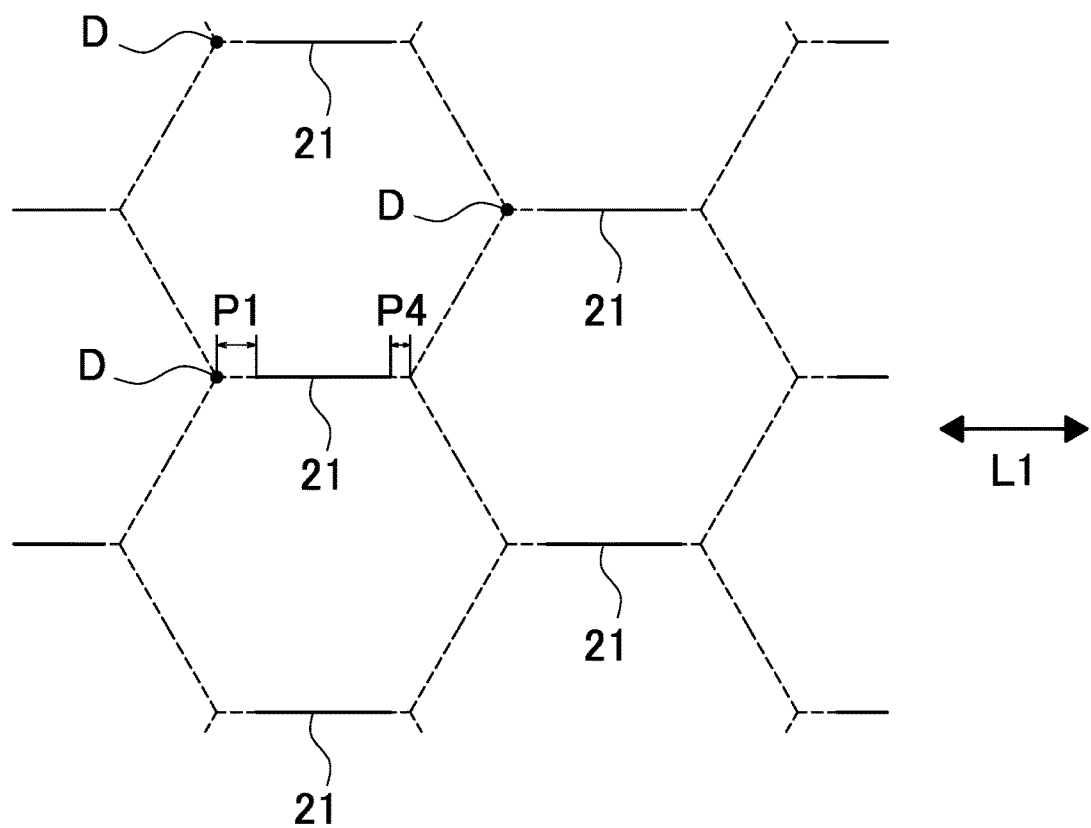
FIG. 6A is a plan view schematically showing first cleavage starting portions formed by focusing laser light within the substrate.
Figure 6B:
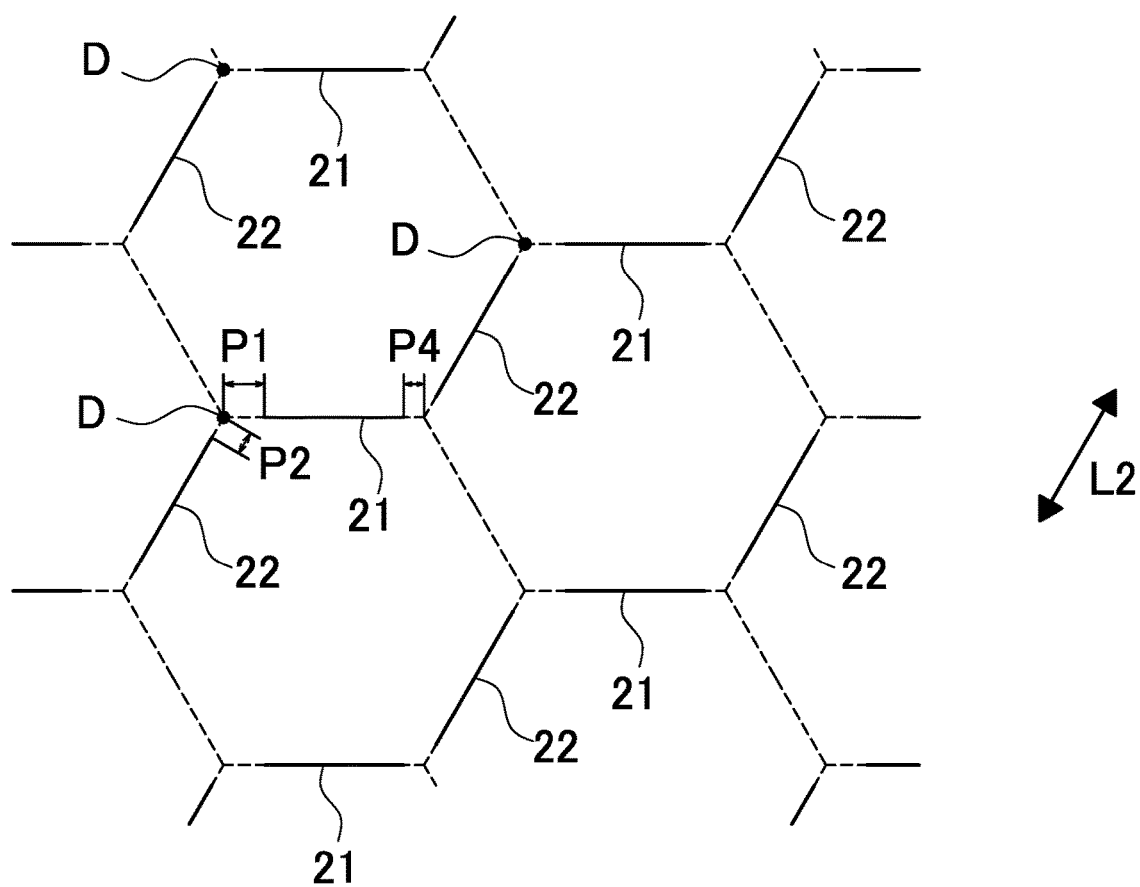
FIG. 6B is a plan view schematically showing second cleavage starting portions formed by focusing laser light within the substrate.
Figure 6C:
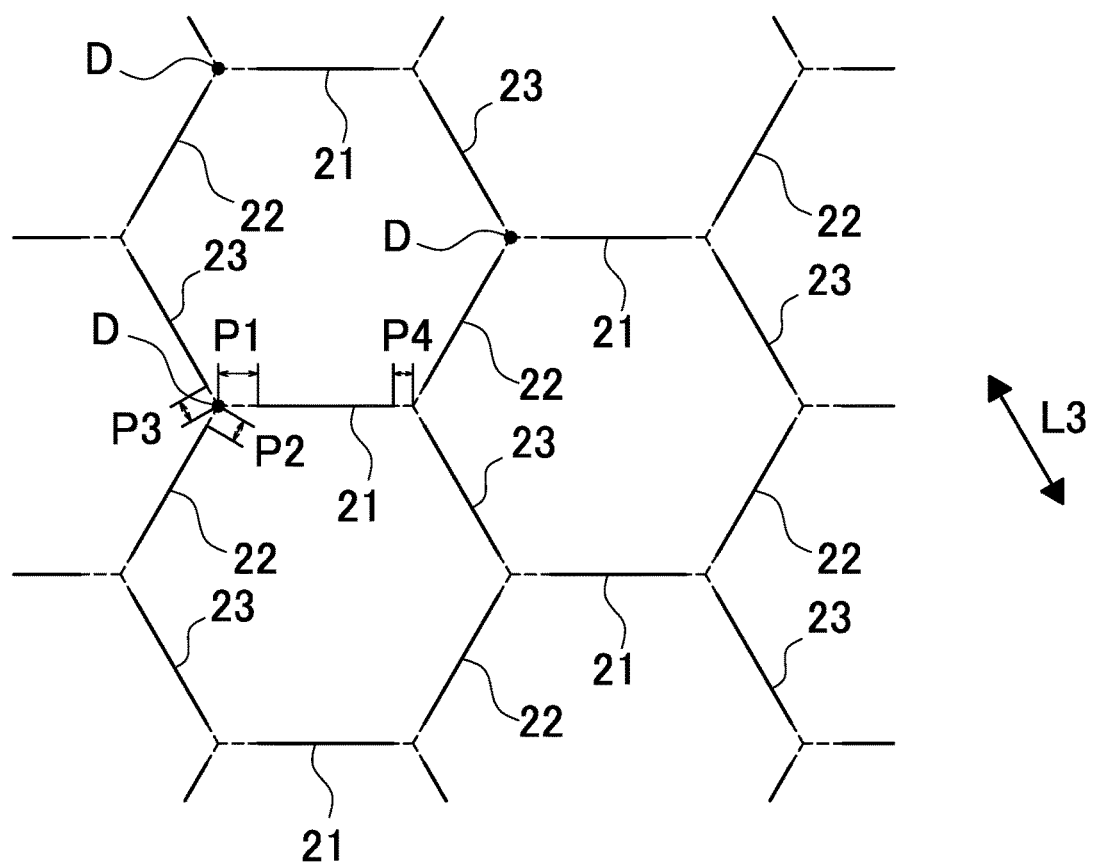
FIG. 6C is a plan view schematically showing third cleavage starting portions formed by focusing laser light within the substrate.

As shown in FIGS. 6A-6C, when a first cleavage starting portion 21 is formed between two vertex points of a hexagonal light emitting device 100, it is desirable to establish a first interval P1 between the laser scan end point and one vertex point, and establish an interval P4, which is shorter than the first interval P1, between the laser scan starting point and the other vertex point. If the interval between a cleavage starting portion 20 and a vertex point D is made too wide, there is a possibility that cracks extending from the cleavage starting portion 20 may not reach the vertex point D and may be too far away from cracks extending from other cleavage starting portions 20 for clean wafer cleaving. As a result of the techniques described above for the present embodiment, unintended extension of first cracks from laser scan end points can be suppressed while first cracks from laser scan starting points can connect with good precision to cracks extending from other cleavage starting portions 20.

Note, in the case where a plurality of cleavage starting portions 20 are formed in the thickness direction of the substrate 102, crack extensions from first cleavage starting portions 21 are primarily affected by scribe formation conditions for the first cleavage starting portion 21 closest to the lower surface of the substrate 102. Consequently, when a plurality of first cleavage starting portions 21 are formed in a vertical stack within the substrate 102, it is sufficient to form the first cleavage starting portion 21 closest to the lower surface of the substrate 102 in accordance with previously described conditions such as laser scan direction and first interval P1 separation. This principle similarly holds for vertically stacked second cleavage starting portions 22 and third cleavage starting portions 23 described subsequently.

Second Cleavage Starting Portion Formation Step

Next, as shown in FIGS. 4 and 5B, each second cleavage starting portion 22 is formed separated by a second interval P2, which is shorter than the first interval P1, from vertex point D. Here, the second cleavage starting portion 22 is formed as a line segment such that a second straight-line L2 extending from the second cleavage starting portion 22 will pass through the vertex point D. The angle between the second straight-line L2 and the first straight-line L1 is 120°.

In the first cleavage starting portion formation step and the second cleavage starting portion formation step, cleavage starting portions 20 are formed with different angular orientations (different laser scanning directions) on the wafer 10 viewed from above. Accordingly, from a processing standpoint, there is an (inevitable) given time lag after the first cleavage starting portion formation step prior to the second cleavage starting portion formation step. Consequently, if first cleavage starting portions 21 and subsequently formed second cleavage starting portions 22 are made with the same separation distance (interval) from vertex points D, there is a high probability during die separation (cleaving) that second cracks will have too much separation from vertex points D even though first cracks extend to the light emitting device regions 14. Therefore, second cleavage starting portions 22 in the present embodiment are formed leaving second interval P2 separation from vertex points D, where the second interval P2 is shorter than the first interval P1. This configuration establishes tolerance in the time required for first cracks to extend to light emitting device regions 14 disposed at the ends of the first straight-lines L1, while making it easy for first and second cracks to connect.

The second interval P2 can be, for example, greater than or equal to 6 μm and less than or equal to 12 μm, and preferably greater than or equal to 7 μm and less than or equal to 9 μm. By making the second interval P2 greater than or equal to 6 μm, second crack extensions into light emitting device regions 14 can be suppressed. Further, making the second interval P2 less than or equal to 10 μm enables accurate connection of second cracks with cracks extending from other cleavage starting portions 20.

Third Cleavage Starting Portion Formation Step

Next, as shown in FIGS. 4 and 5C, each third cleavage starting portion 23 is formed separated from vertex point D by a third interval P3, which is shorter than the first interval P1. Here, the third cleavage starting portion 23 is formed as a line segment such that a third straight-line L3 extending from the third cleavage starting portion 23 will pass through the vertex point D. The third straight-line L3 makes a 120° angle with both the first straight-line L1 and the second straight-line L2.

By forming the third interval P3 shorter than the first interval P1, extension of cracks from third cleavage starting portions 23 (subsequently referred to as third cracks) into light emitting device regions 14 can be suppressed, while enabling precise connection of third cracks with both the first and second cracks.

While the third interval P3 can be the same length as the second interval P2, the third interval P3 can also be made shorter than the second interval P2. When third cleavage starting portions 23 are formed, first cracks and second cracks are already established in the substrate 102. This makes it easy for third cracks to connect with first and second cracks, and consequently, makes it difficult for third cracks to extend into light emitting device regions 14. Therefore, forming the third interval shorter than the second interval makes it possible for third cracks to connect with greater precision to first and second cracks while restraining third crack extensions into light emitting device regions 14.

Wafer Cleaving Step

The wafer 10 is cleaved along the cleavage starting portions 20 to obtain a plurality of light emitting devices 100 having a hexagonal layout in plan view. The wafer 10 cleaves along cleaving lines 12, which are established by cleavage starting portions 20 formed in the cleavage starting portion formation step and cracks extending from those cleavage starting portions 20. This separates the wafer 10 into a plurality of light emitting devices 100, singulated dices.

If the wafer cleaving step is performed before cracks extending from the cleavage starting portions 20 reach the lower surface of the substrate 102, there is a tendency for wafer 10 cleaving along cleaving lines 12 to become more difficult. Accordingly, it is desirable to perform the wafer cleaving step after cracks extending from the cleavage starting portions 20 established in the cleavage starting portion formation step have reached the lower surface of the substrate 102. This makes it possible to cleave the wafer 10 with more precision and cleanly singulate the plurality of light emitting devices 100.

Light emitting devices 100 obtained by dicing a wafer 10 according to the method of manufacture for the present embodiment have approximately regular hexagonal shapes. As shown in FIG. 7, cleavage starting portions 20 positioned inside the substrate 102 during the previously described cleavage starting portion formation step leave laser scribe marks on the sides of the cleaved substrate 102. Further since the cleavage starting portions 20 are formed within the substrate 102 while leaving either first, second, or third intervals P1, P2, P3, regions exist in the vicinity of the intersection of adjacent sides where there are no marks due to cleavage starting portion 20 formation.

As shown in FIG. 8, each light emitting device 100 has a semiconductor structure 104 disposed on the upper surface of the substrate 102. Specifically, the semiconductor structure 104 has an n-type semiconductor layer 104n, an active layer 104a, and a p-type semiconductor layer 104p stacked in that order on the upper surface of the substrate 102. Nitride semiconductor material such as $In_xAl_yGa_{1-x-y}N$ (where $0 \le X$, $0 \le Y$, and $X+Y<1$) can be used to form the n-type semiconductor layer 104n, active layer 104a, and p-type semiconductor layer 104p. The n-type semiconductor layer 104n is electrically connected to an n-side electrode 103A, and the p-type semiconductor layer 104p is electrically connected to a p-side electrode 103B.

EXAMPLE

A 100 mm (4 inch) wafer 10 was prepared with semiconductor structures 104 having a plurality of nitride semiconductor layers processed in a stack on top of a sapphire substrate 102. Substrate 102 thickness was 200 μm and the upper surface of the substrate 102 corresponded to a C-plane of the sapphire crystal.

Next, a plurality of cleavage starting portions 20 was formed by irradiating laser beam into the lower surface of the substrate 102. Here, the laser beam had a center wavelength of 800 nm, power output of 0.15 W to 0.2 W, and the plurality of cleavage starting portions 20 was formed by focusing laser beam inside the substrate 102 at locations 100 μm, 60 μm, and 30 μm from the lower surface of the substrate 102 in the thickness direction. Cleavage starting portions 20 were formed in a pattern that would cleave the wafer into light emitting devices 100 having a hexagonal layout, and that cleaving pattern partitioned the semiconductor structures 104 into a plurality of light emitting device regions 14. Each light emitting device region 14 had essentially a regular hexagonal shape with equal sides approximately 1940 μm in length.

The cleavage starting portion formation step was implemented by dividing it into three process steps: the first cleavage starting portion formation step, the second cleavage starting portion formation step, and the third cleavage starting portion formation step. Each of the first, second, and third cleavage starting portions in those cleavage starting portion formation steps was formed between two adjacent vertices of a hexagonal light emitting device. In addition, each individual light emitting device region 14 was established by forming two first cleavage starting portions, two second cleavage starting portions, and two third cleavage starting portions within a given area. In each cleavage starting portion formation step, the laser was scanned in pulse mode in an a-plane direction of the substrate 102 to form a plurality of first, second, and third cleavage starting portions along a-planes of the sapphire crystal substrate 102.

In the first cleavage starting portion formation step, straight-line first cleavage starting portions 21 were formed with each endpoint separated by a 16 μm distance (first interval P1) from a hexagon vertex point D. Here, each linear first cleavage starting portion 21 was formed a first straight-line L1 extending from the first cleavage starting portion 21 pass through the vertex point D. Further, the starting point of each first cleavage starting portion 21 was also formed 16 μm away from another hexagon vertex point adjacent to point D.

Next, in the second cleavage starting portion formation step, straight-line second cleavage starting portions 22 were formed with each endpoint separated by an 8 μm distance (second interval P2) from a hexagon vertex point D. Here, each linear second cleavage starting portion 22 was formed a second straight-line L2 extending from the second cleavage starting portion 22 pass through the vertex point D and forming a 120° angle with the first straight-line L1. Further, the starting point of each second cleavage starting portion 22 was also formed 8 μm away from another hexagon vertex point adjacent to point D.

Next, in the third cleavage starting portion formation step, straight-line third cleavage starting portions 23 were formed with each endpoint separated by an 8 μm distance (third interval P3) from a hexagon vertex point D. Here, each linear third cleavage starting portion 23 was formed a third straight-line L3 extending from the third cleavage starting portion 23 pass through the vertex point D and form 120° angles with both the first straight-line L1 and the second straight-line L2. Further, the starting point of each third cleavage starting portion 23 was also formed 8 μm away from another hexagon vertex point adjacent to point D.

For comparison, light emitting devices were also fabricated by the same processing method as the present embodiment except that in each of the first, second, and third cleavage starting portion formation steps, a uniform 8 μm separation distance was established between each cleavage starting portion 20 and each vertex point D.

In the case of the comparison processing method, the percentage of cracks extending from cleavage starting portions 20 into light emitting device regions 14 was high, die chipping occurred in a large number of light emitting devices during wafer 10 cleaving and die singulation, and there was a tendency for yield to be low. In contrast, for the processing method of the present embodiment, crack extensions from cleavage starting portions 20 into light emitting device regions 14 were reduced, die chipping at wafer 10 cleaving and die singulation were suppressed, and an improved yield was achieved.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the spirit and scope of the invention as defined in the appended claims.

The invention claimed is:

1. A method of manufacturing a light emitting device, the method comprising:
   preparing a wafer having a sapphire substrate with semiconductor structures disposed on an upper surface of the substrate;
   forming a plurality of straight-line cleavage starting portions within the substrate by scanning a laser beam, the forming step comprising
      forming first cleavage starting portions such that each of the first cleavage starting portions is separated by a first interval from a common vertex point of three adjacent hexagonal light emitting devices, and that a straight-line extending from the first cleavage starting portion passes through the common vertex point,
      forming second cleavage starting portions such that each of the second cleavage starting portions is separated by a second interval, which is shorter than the first interval, away from the common vertex point, and that a straight-line extending from the second cleavage starting portion passes through the common vertex point and forms a substantially 120° angle with the straight-line extending from the first cleavage starting portion, and
      forming third cleavage starting portions such that each of the third cleavage starting portions is separated by a third interval, which is shorter than the first interval, away from the common vertex point, and a straight-line extending from the third cleavage starting portion passes through the common vertex point and forms substantially 120° angles with both the straight-line extending from the first cleavage starting portion and the straight-line extending from the second cleavage starting portion; and
   cleaving the wafer along the cleavage starting portions to obtain a plurality of light emitting devices each having a hexagonal shape in plan view.

2. The method according to claim 1, wherein each vertex of a hexagonal light emitting device serves as the common vertex point, and in the step of forming the plurality of straight-line cleavage starting portions, either a first cleavage starting portion, a second cleavage starting portion, or a third cleavage starting portion is formed between two adjacent common vertex points of the hexagonal light emitting device.

3. The method according to claim 2, wherein the first cleavage starting portions are formed in the first cleavage starting portion formation step by scanning the laser beam towards each of three vertex points, which are every other vertex point of a six vertex hexagonal light emitting device in plan view.

4. The method according to claim 3, wherein in the first cleavage starting portion formation step, each first cleavage starting portion is formed such that a separation distance between a laser scan end point and one of the three vertex points, which is in a vicinity of the laser scan end point, is greater than a separation distance between a laser scan starting point and one of three other vertex points, which is in a vicinity of the laser scan starting point.

5. The method according to claim 4, wherein the first interval is greater than or equal to 12 µm and less than or equal to 20 µm.

6. The method according to claim 5, wherein the second interval is greater than or equal to 6 µm and less than or equal to 12 µm.

7. The method according to claim 6, wherein the third interval is shorter than the second interval.

8. The method according to claim 2, wherein the cleaving step to obtain a plurality of light emitting devices is performed after cracks from the cleavage starting portions have reached a lower surface of the substrate.

9. The method according to claim 2, wherein each of the plurality of cleavage starting portions formed in the step to form a plurality of cleavage starting portions is formed along an a-plane of a substrate crystal.

10. The method according to claim 1, wherein the first cleavage starting portions are formed in the first cleavage starting portion formation step by scanning the laser beam towards each of three vertex points, which are every other vertex point of a six vertex hexagonal light emitting device in plan view.

11. The method according to claim 10, wherein in the first cleavage starting portion formation step, each first cleavage starting portion is formed such that a separation distance between a laser scan end point and one of the three vertex points, which is in a vicinity of the laser scan end point, is greater than a separation distance between a laser scan starting point and one of three other vertex points, which is in a vicinity of the laser scan starting point.

12. The method according to claim 11, wherein the first interval is greater than or equal to 12 µm and less than or equal to 20 µm.

13. The method according to claim 12, wherein the second interval is greater than or equal to 6 µm and less than or equal to 12 µm.

14. The method according to claim 13, wherein the third interval is shorter than the second interval.

15. The method according to claim 1, wherein the first interval is greater than or equal to 12 µm and less than or equal to 20 µm.

16. The method according to claim 15, wherein the second interval is greater than or equal to 6 µm and less than or equal to 12 µm.

17. The method according to claim 16, wherein the third interval is shorter than the second interval.

18. The method according to claim 1, wherein the third interval is shorter than the second interval.

19. The method according to claim 1, wherein the cleaving step to obtain a plurality of light emitting devices is performed after cracks from the cleavage starting portions have reached a lower surface of the substrate.

20. The method according to claim 1, wherein each of the plurality of cleavage starting portions formed in the step to form a plurality of cleavage starting portions is formed along an a-plane of a substrate crystal.

* * * * *